(12) United States Patent
Graf et al.

(10) Patent No.: US 6,571,859 B2
(45) Date of Patent: Jun. 3, 2003

(54) HEAT SINK AND PROCESS AND MOLDING TOOL FOR PRODUCTION OF SAME

(75) Inventors: Werner Graf, Engen (DE); Uwe Bock, Singen (DE)

(73) Assignee: Alcan Technology & Management Ltd., Rheinfall (CH)

( * ) Notice: Subject to any disclaimer, the term of this patent is extended or adjusted under 35 U.S.C. 154(b) by 0 days.

(21) Appl. No.: 10/095,684

(22) Filed: Mar. 11, 2002

(65) Prior Publication Data

US 2002/0096313 A1 Jul. 25, 2002

Related U.S. Application Data

(62) Division of application No. 09/925,272, filed on Aug. 9, 2001.

(51) Int. Cl.[7] .......................... B22D 19/00; B22D 33/04
(52) U.S. Cl. ..................... 164/109; 164/111; 164/137; 164/122
(58) Field of Search ............................... 164/109, 288, 164/137, 341, 122, 111

(56) References Cited

U.S. PATENT DOCUMENTS 5,962,034 A * 10/1999 Matsumoto et al. ........ 425/111
6,253,829 B1 * 7/2001 Mashiko et al. ............ 164/109

* cited by examiner

Primary Examiner—Tom Dunn
Assistant Examiner—I. H. Lin
(74) Attorney, Agent, or Firm—Bachman & LaPointe, P.C.

(57) ABSTRACT

A heat sink of metal material, in particular a light metal alloy, for semi-conductor elements or similar components, has plate-like cooling ribs projecting from a base plate at intervals (f) and approximately parallel to each other, protrude with a connection strip into the base plate in which they are cast. A molding tool designed for production of the heat sink includes a casting mold with a mold chamber for the base plate. The mold chamber contains an area to receive the connection strips of the cooling ribs. Two parallel side walls of the casting mold and intermediate layers arranged parallel between them, each defining a receiver gap, are arranged displaceably on at least one shaft passing through them. The walls can be moved to produce the compact casting mold after insertion of the cooling ribs in the receiver gaps.

6 Claims, 2 Drawing Sheets

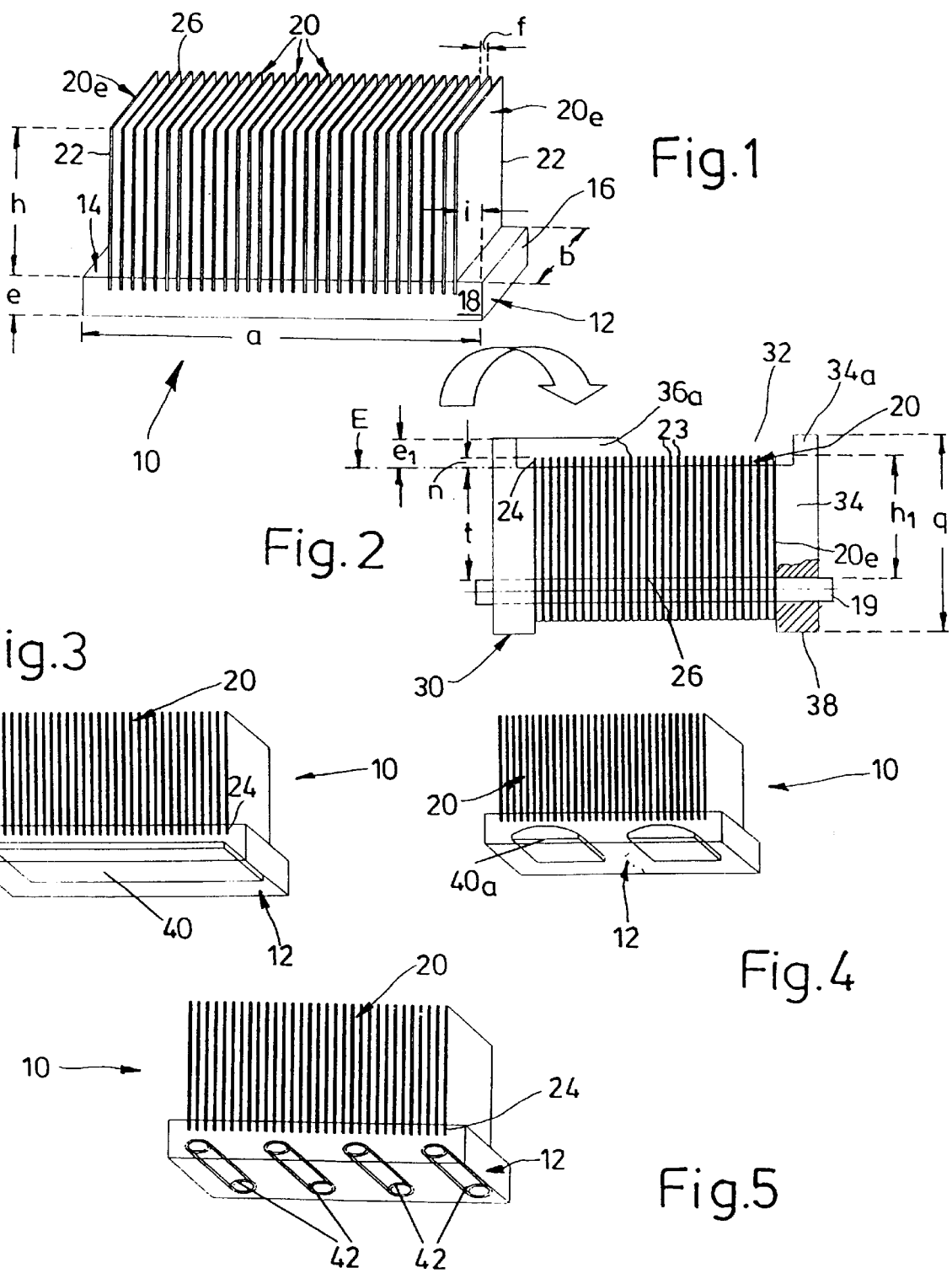

HEAT SINK AND PROCESS AND MOLDING TOOL FOR PRODUCTION OF SAME

Figure 6:
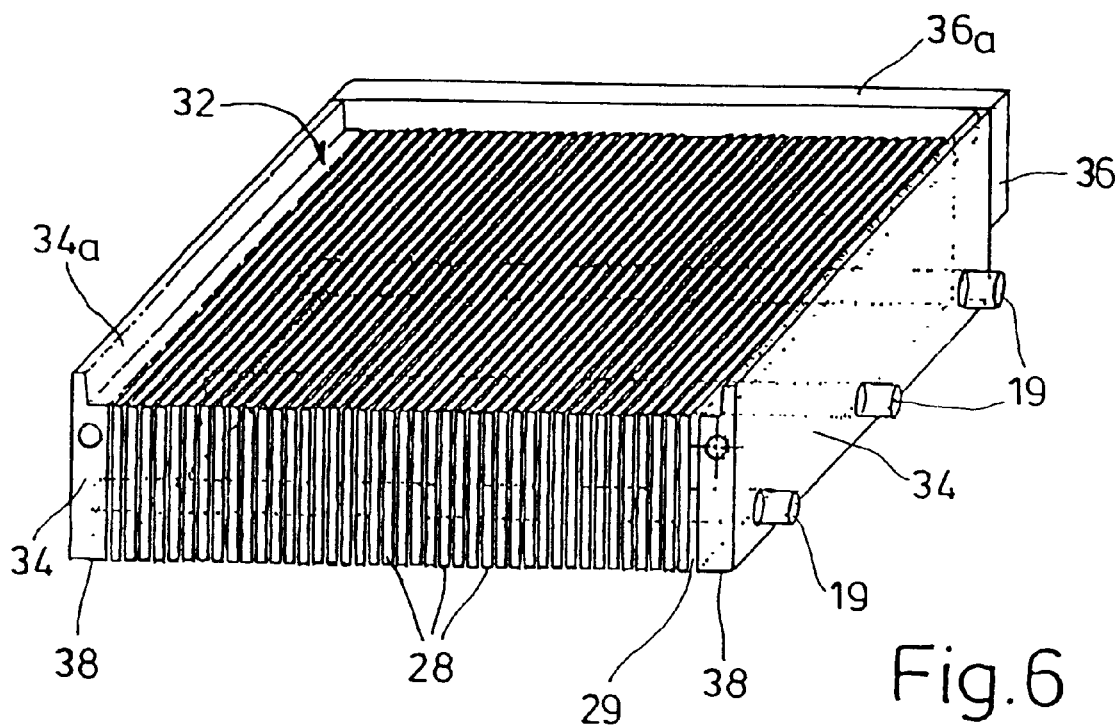

This is a Division, of application Ser. No. 09/925,272, filed Aug. 9, 2001.

BACKGROUND OF THE INVENTION

The invention concerns a heat sink of metallic material, in particular a light metal alloy, for semi-conductor elements or similar components, with cooling ribs projecting from a base plate parallel to each other and spaced apart, with approximately rod-like cross section, and which protrude into the base plate with a connection strip. The invention also comprises a process for the production of these and a molding tool for these.

DE 35 18 310 C2 discloses a heat sink with a base plate of an AlMgSi alloy extruded in an extrusion die as a molding tool, in the surface of which body are formed insert grooves for the plate-like cooling ribs made from a sheet or profile. The ribs have a base which, after insertion in one of the grooves, is distorted by a caulking process. With very close rib spacing and deep cooling ribs, the load on the caulking chisel is so great that it quickly kinks. In other known cooling bodies the cooling ribs can be glued or soldered in place. Gluing has the disadvantage that the glue causes a deterioration in the heat transmission from the base plate or plinth to the cooling rib. For soldering, again costly preliminary treatment is required.

For another heat sink according to DE 25 02 472 C2, the base plate is also produced with grooves, the walls of which in their longitudinal direction are fitted with pressed-out wall ribs. Cooling ribs with vertical fluting are pressed in these grooves by means of cold pressure welding. The necessary high forces which must be applied in the cold pressure welding process greatly limit the length of the cooling bodies to be produced, and a minimum thickness of cooling ribs is required in order to avoid their kinking during the cold pressure welding process.

It is not only the forces occurring which limit the length of the cooling body. The vertical fluting of the cooling ribs limits their length measured along the base plate due to the dimensions of the extrusion tool as the pressing direction is the same as the fluting direction.

Accordingly, it is an object of the present invention to provide a cooling body which does not have the defects described. Also, the heat conductivity or control of heat conduction is improved.

SUMMARY OF THE INVENTION

The foregoing object is achieved wherein, the base plate consisting of metal material is cast onto the metallic cooling ribs in the area of their connection strips, i.e. no subsequent insertion and deformation processes are required. The casting process also allows integration of inserts of heat conductive material to increase the conductivity and to control the heat conduction.

According to a further feature of the invention, at least one insert of good conductive material is cast into the base plate; as inserts, preferably heat pipes to control the heat conduction can be used.

Favourably, several heat pipes are used as inserts which run parallel to each other and to the faces of the base plate. Also, the inserts extend between the parallel sides of the base plate.

The scope of the invention includes a process for production of such a cooling body in which, to form cooling ribs, plate-like moldings are arranged at intervals in a mold, approximately parallel to each other so that their connection strips of specific height protrude into the chill mold chamber for the base plate, and this mold chamber is filled with the metallic material as a casting compound; when this hardens, the connection strips are held firmly by the base plate and subsequently form a unit with this.

To simplify the casting process, by the use of intermediate layers parallel to each other receiver gaps for the plate-like moldings are produced and the latter inserted in the receiver gaps, whereupon two side walls parallel to the intermediate layers are brought together under pressure in order to create a compact mold for preparation of the casting.

According to a further feature of the invention, before filling with the hot casting compound, inserts of heat conductive material are arranged in the mold chamber in order to be cast into the base plate.

As a molding tool according to the invention, a casting mold is used with a mold chamber for the base plate or plinth, to which, before the actual casting process, are allocated the parallel cooling ribs made from a sheet or profile so that their foot edges and adjacent connection strips protrude into the area established for the casting compound and are there held by the latter during the casting process; after hardening of the casting compound, the cooling body with metal constituents connected internally is then ready for use.

In the molding tool according to the invention, two parallel side walls, and intermediate layers between them and also parallel, are arranged displaceably on at least one shaft passing through them; the plate-like moldings are pressed into the receiver gaps bordered by the intermediate layers until they contact the shaft(s), the side walls are then compressed in the shaft direction until a compact casting mold is achieved. Its mold base is substantially determined by the foot edges of the intermediate layers.

DRAWINGS

Figure 7:
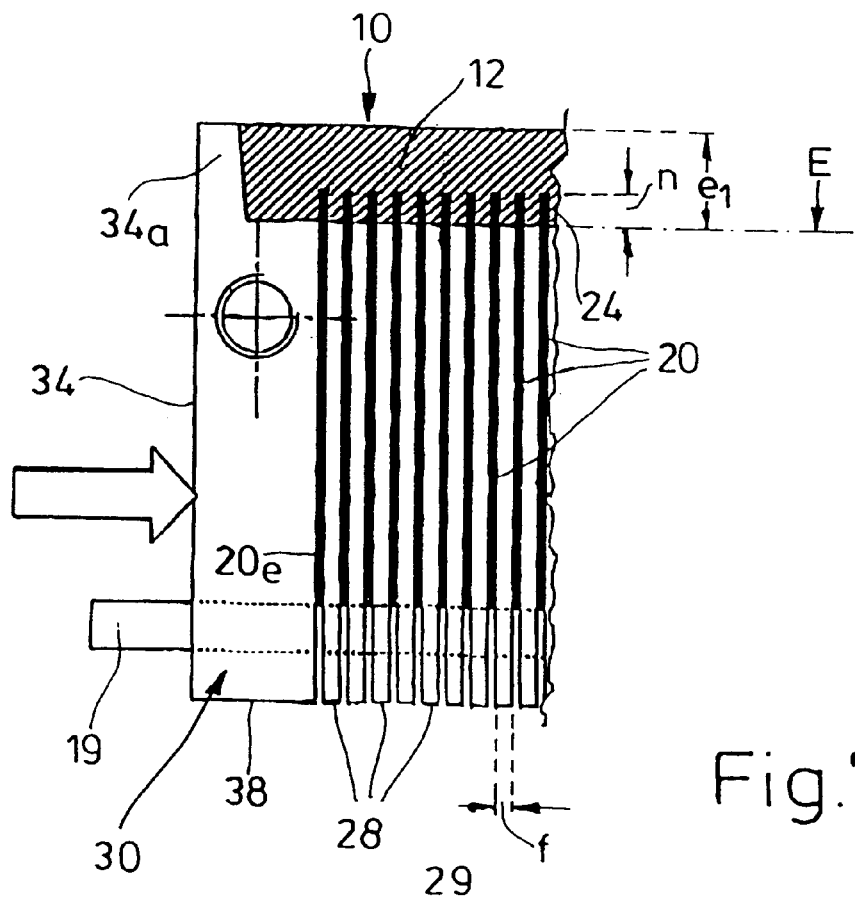

Further advantages, features and details of the invention arise from the description of preferred design examples below and using the drawing; these show:

FIG. 1: a perspective view onto a cooling body with parallel cooling ribs protruding from a base plate;

FIG. 2: a top view onto a mold as a device for production of the cooling body;

FIG. 3 to FIG. 5: a perspective view under the base plate of three different embodiments of the cooling body;

FIG. 6: a perspective view onto the mold for production of the cooling body;

FIG. 7: an enlarged section of FIG. 6 in front view.

DETAILED DESCRIPTION

A longitudinally approximately comb-like cooling body 10 of an aluminium alloy, for example an AlMgSi alloy, for semi-conductor elements, not shown further in the drawings for the sake of clarity, has a base plate 12 of length a, width b and height e with plate-like cooling ribs 20 of free height h projecting above the surface 14 of base plate 12 at close intervals f. The distance between a plane E determining the surface 14 of the base plate 12 and the upper contour of a shaft 19 visible in FIG. 2 in the casting position shown, and which runs parallel to the base plate 12, is marked t.

The two end cooling ribs 20e each run to the adjacent end face 16 of the base plate 12 at distance i, the length of which corresponds almost to plate height e. The side edges 22 of the cooling ribs 20, 20e align with the side surface 18 of the base plate 12.

To produce the cooling body 10, the cooling ribs 20, 20e made from sheets or profiles and of total height h1 and in between intermediate layers 28 (See FIG. 6 and FIG. 7) determining their rib spacing f (see FIG. 7), are laid in a mold 30 of steel so that in each case a short connection strip 24 of height n starting from the foot edge 23 of cooling ribs 20, 20e protrudes into a mold chamber 32 of the mold 30, the base of which is determined by the said plane E and the height of which e1 corresponds to a multiple of the height n of the said connection strip 24.

FIGS. 6 and 7 show particularly clearly that the mold 30 has two side walls 34 and several parallel intermediate layers 28 bordering between them receiver gaps 29 of width f, where the number of intermediate layers is lower than the number of cooling ribs 20, 20e. The side walls 34 and the intermediate layers 28 can be displaced on the shaft 19 passing through them so that thickness tolerances of the cooling ribs 20, 20e can be compensated. The latter, starting from the top in FIGS. 6, 7, are pressed between the intermediate layers 28 until their crest edges 26 lie on the shafts 19. The mold or chill mold 30 is then compressed in the shaft direction by pressure means, arrow FIG. 7, i.e. closed downwards. At the free face ends cover plates 36 are applied as bordering walls. Molding strips 34a, 36a of one piece with the side walls 34 and the face walls or cover plates 36 form the border of the fully enclosed chill mold chamber 32 of a base plate or plinth mold into which, as stated, the cooling ribs 20, 20e protrude by the said dimension n, where in contrast the adjacent foot edges 27 of the intermediate layers 28 run in the said plane E i.e. they form the substantial part of the mold base. When this mold chamber 32 is evacuated, the cooling ribs 20, 20e are firmly connected with the base plate 12.

The chill mold chamber 32 is shown in the upper part of FIG. 2 within the molding strips 34a, 36a of the mold 30 which determine it. The height q at least of the side walls 34 is dimensioned such that in the casting position sketched in FIG. 2 these extend with their wall face edges 38 beyond the crest edges 26 of the cooling ribs 20, 20e. The evacuation of the chill mold chamber 32, as shown in particular in FIG. 7, produces the base plate 12 of the valve body 10 in which are cast—and subsequently established after hardening—the cooling ribs 20, 20e with their feet sections or connection strips 24.

Depending on the arrangement of the electronic components, before the casting process, plate-like—flat or curved—parts 40 or 40a of particularly good heat conduction material can be laid in the mold chamber 32 which increase the conductivity or control the heat distribution; these inserts 40, 40a are cast into the base plate 12 according to FIGS. 3, 4.

Instead of the plate-like inserts 40, 40a heat pipes 42 can be inserted to control the heat conduction. In FIG. 5 heat pipes 42 run in the base plate 12 parallel to each other and to the faces 16 of the base plate 12. Like the plate-like inserts 40, 40a, they extend between the parallel side surfaces 18 of the base plate 12.

What is claimed is:

1. A process for the production of a heat sink comprising the steps of:

providing a mold defining a first space for receiving a plurality of space apart intermediate layers therein, the intermediate layers define therebetween a plurality of receiver gaps of width f, the mold further defining a second space forming a chill mold chamber, wherein the receiver gaps opening into the chill mold chamber, the mold comprising opposed substantially parallel face walls having opposed facing surfaces substantially parallel to the intermediate layers wherein each of the surfaces has a first sidewall portion which together defines the first space and a stepped upper sidewall portion which defines the second space above the first space, wherein the two face walls and the intermediate layers are displaceably mounted on support means;

positioning cooling ribs into the plurality of receiver gaps wherein a portion of each cooling rib extends into the chill mold chamber a distance n to form connection strips; and casting molten metal into the chill mold chamber around the connection strips and cooling the metal to form a base plate cast to the cooling ribs.

2. A process according to claim 1, wherein the process includes moving the two face walls toward each other after the positioning and prior to the casting.

3. A process according to claim 2, wherein the support means is a shaft.

4. A process according to claim 3, wherein the two face walls have in-line orifices for receiving the shaft.

5. A process according to claim 1, wherein prior to casting, inserts of heat conductive material are located in the chill mold chamber.

6. A process according to claim 1, including locating a part formed of good heat conduction material in the chill mold chamber prior to cast and casting molten metal so that the molten metal entirely encloses the part.

* * * * *